United States Patent
Usgaonkar

(10) Patent No.: US 9,222,976 B1
(45) Date of Patent: Dec. 29, 2015

(54) METHODS AND CIRCUITS FOR DEBUGGING MULTIPLE IC PACKAGES

(71) Applicant: Xilinx, Inc., San Jose, CA (US)

(72) Inventor: Kapil Usgaonkar, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/745,860

(22) Filed: Jun. 22, 2015

(51) Int. Cl.
*H03K 19/00* (2006.01)
*G01R 31/3177* (2006.01)

(52) U.S. Cl.
CPC .................................. *G01R 31/3177* (2013.01)

(58) Field of Classification Search
CPC ...................... G01R 31/3177; G01R 31/31937; G01R 31/31725
USPC ........................................ 326/16, 93; 714/700
See application file for complete search history.

(56) References Cited

U.S. PATENT DOCUMENTS

| 2011/0235459 A1* | 9/2011 | Ware | G11C 7/04 365/233.11 |
| 2014/0340969 A1* | 11/2014 | Jung | G11C 7/222 365/189.05 |
| 2015/0019803 A1* | 1/2015 | Miller | G06F 3/0611 711/105 |
| 2015/0234008 A1* | 8/2015 | Miller | G01R 31/3177 714/734 |

* cited by examiner

*Primary Examiner* — Don Le
(74) *Attorney, Agent, or Firm* — LeRoy D. Maunu

(57) ABSTRACT

Various example implementations are directed to circuits and methods for debugging multiple integrated circuit (IC) packages. According to an example implementation, a first logic analyzer in a first IC package determines a latency of a data link. In response to test input data, the first logic analyzer communicates the test input data to a second IC package, via the data link, and captures a first set of data signals from a logic circuit in the first IC package. In response to test input data, a second logic analyzer in the second IC package captures a second set of data signals from a second logic circuit and communicates the second set of data signals to the first logic analyzer circuit via the data link. The first logic analyzer aligns the first and second sets of data signals, based on the determined latency, and outputs the aligned sets of data signals.

20 Claims, 5 Drawing Sheets

METHODS AND CIRCUITS FOR DEBUGGING MULTIPLE IC PACKAGES

TECHNICAL FIELD

The disclosure generally relates to integrated circuits, and more particularly to testing and debugging of integrated circuits.

BACKGROUND

Programmable logic devices (PLDs) are a well-known type of programmable integrated circuit (IC) that can be programmed to perform specified logic functions. One type of PLD, the field programmable gate array (FPGA), typically includes an array of programmable tiles. These programmable tiles comprise various types of logic blocks, which can include, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

SUMMARY

Various example implementations are directed to circuits and methods for debugging multiple integrated circuit (IC) packages. According to an example implementation, an apparatus includes first and second IC packages. The first IC package includes a first logic circuit and a first logic analyzer circuit coupled to the first logic circuit. The first logic analyzer circuit is configured to determine a first latency of data link between the first and second IC packages. In response to receiving test input data, the first logic analyzer circuit communicates the test input data to the second IC package via the first data link and captures a first set of data signals from the first logic circuit. The second IC package includes a second logic circuit and a second logic analyzer circuit. In response to receiving the test input data, via the data link, the second logic analyzer circuit captures a second set of data signals from the second logic circuit and communicates the second set of data signals to the first logic analyzer circuit via the first data link. The first logic analyzer circuit is further configured to align the first and second sets of data signals, based on the determined first latency, to produce an aligned set of data signals, which is output.

A method is also disclosed for debugging a device including first and second IC packages. Using a first logic analyzer circuit included in a first IC package latency of a data link between the first and second IC packages is determined. In response to receiving test input data at the first IC package, the test input data is communicated to the second IC package via the first data link and a first set of data signals is captured from a logic circuit of the first IC package. In response to receiving test input data, a second logic analyzer circuit included in the second IC package captures a second set of data signals from a logic circuit of the second IC package. The second set of data signals is communicated to the first IC package via the first data link. Using the first logic analyzer circuit, the first and second sets of data signals are aligned, based on the determined latency of the first data link, to produce an aligned set of data signals. The aligned set of data signals are output from the device.

Other features will be recognized from consideration of the Detailed Description and Claims, which follow.

BRIEF DESCRIPTION OF THE DRAWINGS

Various aspects and features of the disclosed methods and circuits will become apparent upon review of the following detailed description and upon reference to the drawings in which.

DETAILED DESCRIPTION

Figure 1:
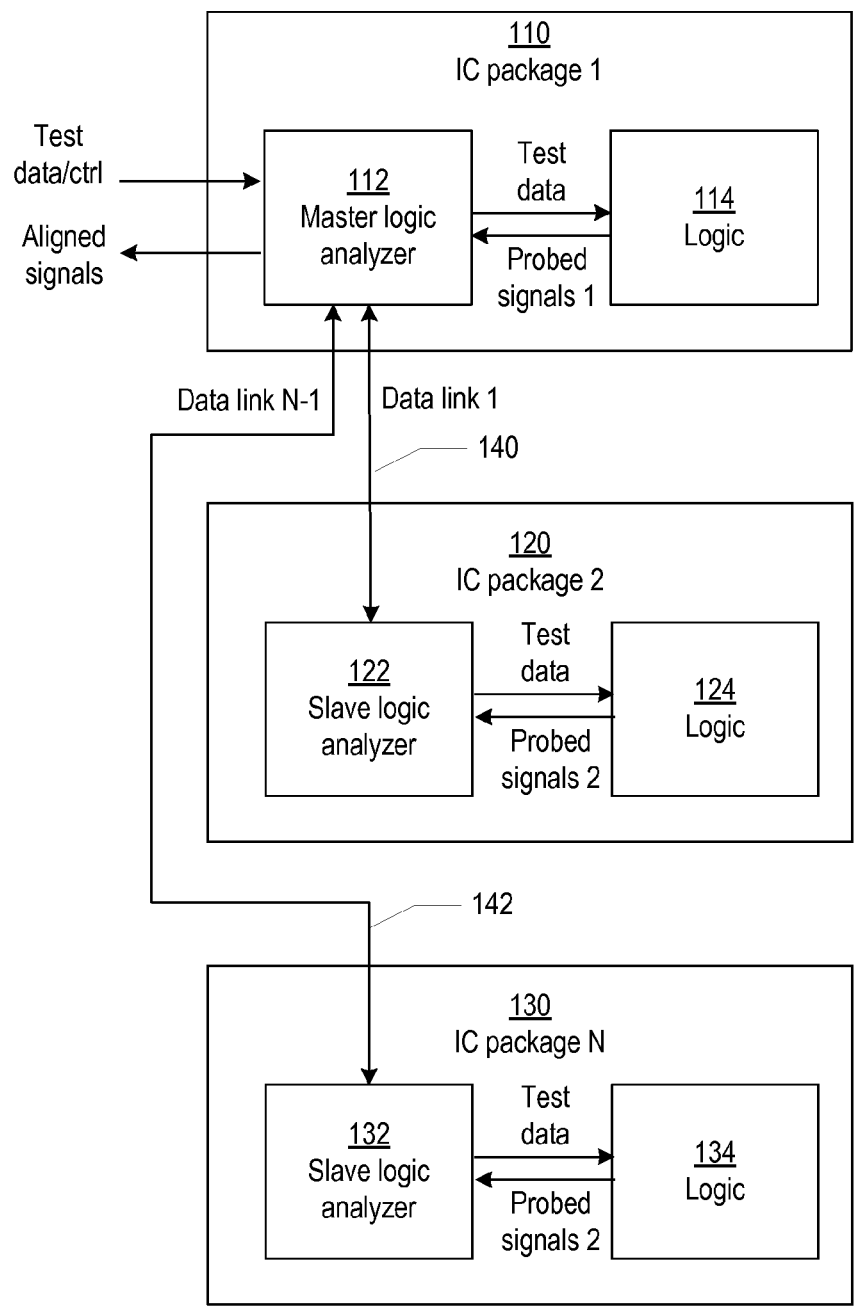
FIG. 1 shows a first device including a plurality of IC packages having logic analyzer circuits configured for alignment of captured data signals.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein.

System-level debugging on hardware is an integral part of developing circuit designs. System-level debugging of circuit designs to be implemented on a programmable IC typically involves testing operation of the programmable IC after it has been programmed to implement the circuit design. The testing of the operation may include, for example, providing test data to the programmable IC and capturing data signals from various nodes within the programmable IC. Commonly, the inputting of test data and capturing of data signals is performed by a debugging interface connected to the programmable IC in an IC package. An IC package provides a protective covering for one or more IC die, external data terminals for communicating data to or from the ICs, and signal lines connecting the data terminals to the ICs and/or interconnecting the ICs.

It is not uncommon for systems to be implemented using multiple interconnected IC packages. However, in system-level debugging across multiple IC packages, it can be difficult to synchronize debugging operations so data signals captured in different IC packages are aligned in time.

Previous debugging approaches utilize a respective debugging interface in each IC package to communicate input test data from a debugging application on a computer connected to the IC package and provide captured data signals from the IC package back to the debugger program. However, input test data may not be provided to each of the IC packages at the same time. Furthermore, data signals may not be captured in each of the IC packages at the same time. As data signals may be captured in the IC packages at different times, it becomes very difficult, if not impossible, to temporally align the captured data signals for debugging.

Methods and circuits are disclosed for synchronized debugging of multiple IC packages. A first logic analyzer circuit in a first IC package acts as a master and coordinates operations of respective logic analyzer circuits in one or more other IC packages. For ease of reference, the first logic analyzer circuit in the first IC package may be referred to as a master logic analyzer circuit and logic analyzer circuits in the other IC packages may be referred to as slave logic analyzer circuits. Each of the master and slave logic analyzers is configured to sample respective data signals in response to a trigger condition such as receipt of test input data from a debugger program. Each of the slave logic analyzer circuits is configured to communicate sampled data signals to the master logic analyzer circuit via a respective data link. The master logic analyzer circuit is configured to align the data signals based on latencies of the data links.

As an illustrative example implementation, a master logic analyzer in a first IC package determines a latency of a data link between the first IC package and a second IC package. In response to test input data, the master logic analyzer communicates the test input data to a slave logic analyzer in the second IC package via the data link. The input test data may include, for example, debugging commands that operate as a trigger condition to prompt a logic analyzer to capture certain data signals of a logic circuit. Additionally or alternatively, the input test data or may include a sequence of data to be input to logic circuits. In response to a sequence of data included in the input test data, the master logic analyzer inputs the sequence to a logic circuit in the first IC package and the slave logic analyzer inputs the sequence to a logic circuit in the second IC package. In further response to the input test data, the master logic analyzer captures a first set of data signals from the logic circuit in the first IC package and the slave logic analyzer captures a second set of data signals from the logic circuit in the second IC package.

The slave logic analyzer communicates the second set of data signals to the master logic analyzer circuit via the data link. The master logic analyzer aligns the first and second sets of data signals, based on the determined first latency, and outputs the aligned sets of data signals. In this manner, the data signals captured from multiple IC packages may be aligned for debugging.

In some implementations, the master logic analyzer may receive and align multiple sets of data signals from multiple slave logic analyzers with the set of data signals captured by the master logic analyzer. For ease of explanation, examples may be primarily described with reference to a system having a single slave logic analyzer coupled to the master logic analyzer. The described examples may be adapted to include additional slave logic analyzers.

The latency of the data link may be determined using various processes. In some implementations, the master logic analyzer is configured to communicate a message from the first IC package to the second IC package over the data link after the link has been established and trained. The slave logic analyzer is configured to, in response to receiving the message, communicate a response from the second IC package to the first IC package via the first data link. The master logic analyzer may determine latency by determining a round-trip time required to communicate a data message to the slave logic analyzer over the data link and receive a response message via the data link. Conversely, in some implementations, the slave logic analyzer may determine latency of the data link based on a round-trip time required to communicate a data message to the master logic analyzer over the data link and receive a response message via the data link. As described in more detail with reference to the figures, in some implementations, the master logic analyzer may align sets of data signals by delaying one or more sets of data signals based on the latency of data link(s) used to communicate the set(s) of data signals to the master logic analyzer. The sets of data signals may be delayed using various circuits including, for example, using a programmable delay configured to buffer the set of data for a specified period of time.

In some implementations, the master and slave logic analyzers may have different circuit arrangements. For instance, circuits of the master logic analyzer for determining latency of a data link and aligning data signals may be omitted from the slave logic analyzer. In some other implementations, the logic analyzers may have a circuit arrangement that is configurable to operate as either a master or a slave logic analyzer. For ease of explanation, the slave logic analyzers are primarily illustrated without circuits of the master logic analyzers for determining latency of the data link and aligning the sets of data signals, for example. It is understood that the slave logic analyzers may be adapted to include additional circuits so it may operate as either a master or a slave logic analyzer.

Different implementations may also utilize various communication protocols to communicate sets of data signals between the slave logic analyzer(s) to the master logic analyzer. For example, the sets of data signals may be communicated between logic analyzers using a high-speed communication protocol such as PCIe, gigabit Ethernet, serial ATA or another communication protocol. Using of a high-speed commutation protocol, a large number of data signals may be captured by a slave logic analyzer and communicated to the master logic analyzer circuit in a serialize format via the data link.

Turning now to the figures, FIG. 1 shows a first device including a plurality of IC packages having logic analyzer circuits configured for alignment of captured data signals. The device 100 includes N IC packages 110, 120, and 130, each having a respective logic circuit 114, 124, and 134 and a respective logic analyzer circuit 112, 122, and 132 for debugging operation of the logic circuit. In the device of FIG. 1, N=3. As previously described, a master logic analyzer circuit 112 in the first IC package 110 is connected to slave logic analyzer circuits 122 and 132 in the other IC packages 120 and 130 by respective data links 140 and 142. The master logic analyzer circuit 112 is configured to determine a latency of the data links 140 and 142.

The master and slave logic analyzers circuits 112, 122, and 132 are configured to sample respective sets of data signals in response to a trigger condition, such as receiving test input data and/or control signals. In response to test input data and/or control signals, the master logic analyzer circuit 112 communicates the test input data and/or control signals to slave logic analyzer circuits 122 and 132 via the data links 140 and 142. Each of the master and slave logic analyzer circuits 112, 122, 124 provides test data to respective logic circuits 114, 124, and 134 to trigger specific operations for testing.

The master logic analyzer circuit 112 captures a first set of data signals from the logic circuit 114. The slave logic analyzer circuit 122 captures a second set of data signals from the logic circuit 124 and communicates the second set of data signals to the master logic analyzer circuit 112 over the data link 140. The slave logic analyzer circuit 132 captures a third set of data signals from the logic circuit 134 and communicates the third set of data signals to the master logic analyzer circuit 112 over the data link 140.

The master logic analyzer circuit 112 aligns the sets of data signals based on the determined latencies of the data links 140 and 142 used to communicate the captured sets of data signals to the master logic analyzer circuit 112. Alignment may be performed by delaying earlier received ones of the sets of data signals. The sets of data signals may be delayed, for example, using data buffers. In some implementations, each set of data signals is delayed to align the set of data signals with a set of data signals received on the data link having the largest determined latency. For ease of explanation, the set of data signals received on the data link having the largest determined latency may be referred to as the slowest set of data signals. The first set of data signals captured by the master logic analyzer circuit 112 may be aligned with the slowest set of data signals by delaying the first set of data signals by an amount of time equal to the determined longest latency. Each set of data signals received on a data link having a latency (L2) less than the largest latency (L1) may be aligned by delaying the set of data signals by an amount of time equal to a difference between the latency of the data link and the largest latency (i.e., L1−L2). The slowest set of data signals is not delayed.

After aligning the data signals, the master logic analyzer circuit 112 outputs the aligned sets of data signals for debugging. For instance, the aligned sets of data signals may be communicated via a debugging interface (e.g., JTAG) to a software-based debugger running on a computer. The master-slave arrangement of logic analyzer circuits allows debugging software to capture aligned sets of data signals from multiple IC packages via a single debugging interface.

Although three IC packages are shown in FIG. 1, the example may be adapted to include fewer or additional IC packages. For ease of reference, the following examples are described with reference to a device having two IC packages.

Figure 2:
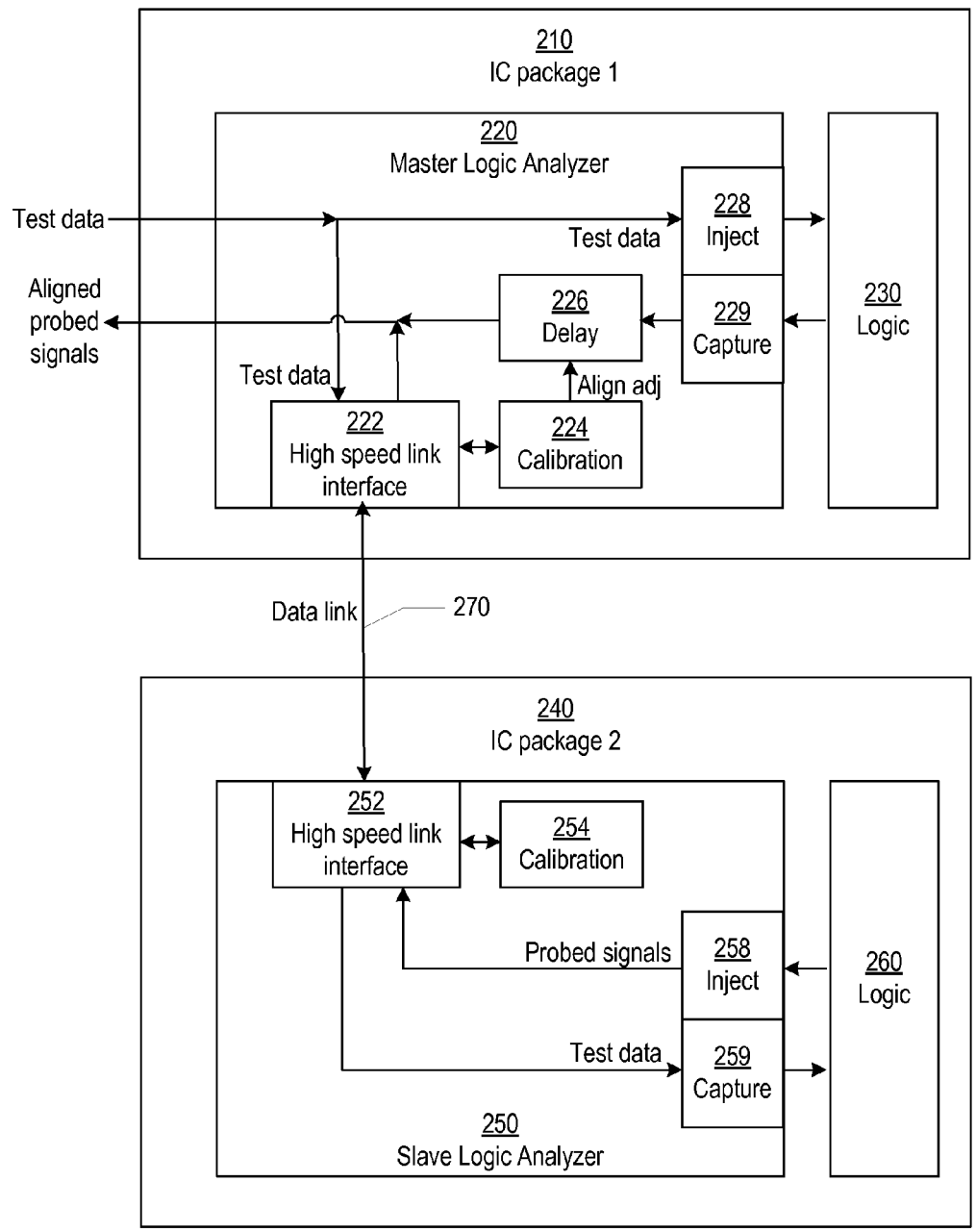
FIG. 2 shows a second device including a plurality of IC packages having logic analyzer circuits configured for alignment of captured data signals.

FIG. 2 shows a second device including a plurality of IC packages having logic analyzer circuits configured for alignment of captured data signals. In this example, the device 200 includes two IC packages 210 and 240, each having a respective logic analyzer circuit 220 and 250 for debugging operation of a logic circuit. A master logic analyzer circuit 220 in the first IC package 210 is connected to a slave logic analyzer circuit 250 in the second IC package 240 via a data link 270. The master and slave logic analyzer circuits 220 and 250 each include a respective high-speed link interface circuit 222 and 252 for communicating data over the data link 270. Calibration circuits 224 and 254 are configured to control the high-speed link interface circuits 222 and 252 to setup and train the data link 270 when the IC packages are powered on. After training the data link 270, the calibration circuits 224 and 254 determine a latency of the data link. In some implementations, calibration circuits 224 and 254 may be powered down after calibrating the data link 270 and determining the latency. In some other implementations, the calibration circuits 224 and 254 may continue to monitor the data link 270 during debugging operations and reset the data link if an error occurs.

When operating in a debug mode, the master and slave logic analyzers circuits 220 and 250 are configured to sample respective sets of data signals in response to a trigger condition, such as receiving test input data and/or control signals. The high-speed link interface 222 of the master logic analyzer circuit 220 communicates input test data and/or control signals to the slave logic analyzer circuit 250 via the data link 270. Respective injection circuits 228 and 258 in the master and slave logic analyzer circuits 220 and 250 provide the input test data to respective logic circuits 230 and 260 to trigger specific operations for testing. A first capture circuit 229 in the master logic analyzer circuit 220 captures a first set of data signals from the logic circuit 230. A second capture circuit 259 in the slave logic analyzer circuit 250 captures a second set of data signals from the logic circuit 230. The high-speed link interface circuit 252 communicates the captured second set of data signals to the master logic analyzer circuit 220 via the data link 270.

The master logic analyzer circuit 220 aligns the sets of data signals based on the determined latency of the data link 270. In this example, the alignment is performed by a programmable delay 226 in the master logic analyzer circuit 220. For instance, in one implementation, the calibration circuit is configured to set the programmable delay 226 to delay the first set of data signals by an output of time equal to the latency exhibited by the data link 270. By delaying the first set of data signals by the determined latency, the first and second sets of signals are aligned. In some implementations, the master logic circuit may also include additional delay circuits (not shown in FIG. 2) to delay sets of data received from slave logic analyzer circuits. As described with reference to FIG. 1, if a system includes multiple slave logic analyzer circuits, the master logic analyzer circuit 220 may delay sets of data signals received from one or more slave logic analyzer circuits to align the sets of data signals with the slowest set. After the sets of data signals are aligned, the master logic analyzer circuit 220 outputs the aligned sets of data signals for debugging.

Figure 3:
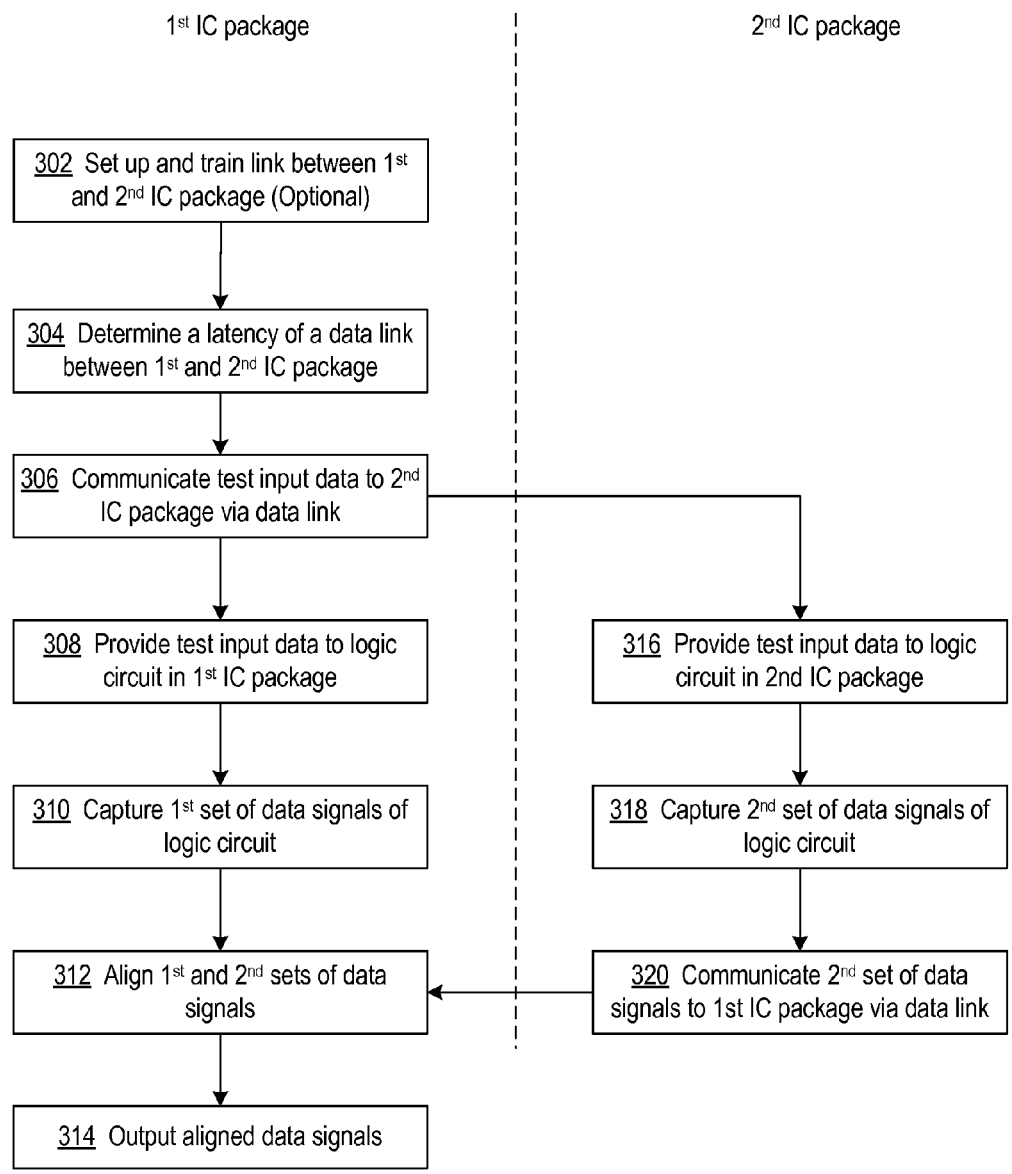
FIG. 3 shows an example process for testing logic circuits on a plurality of IC packages, in accordance with one or more implementations.

FIG. 3 shows an example process for testing logic circuits on a plurality of IC packages, in accordance with one or more implementations. At block 302, the process sets up and trains a data link between first and second IC packages. The setup and training process may differ depending on the protocol used for communication over the data link. Generally, link setup negotiates some initial protocol parameters (e.g., number and polarity of data lanes) between the detected devices on the link. Link training tests communication via data link with different parameter settings to determine a settings that provide the highest bandwidth or least error rate, for example. At block 304, the latency of the data link is determined. Latency may be determined from a round-trip time to transmit a message (e.g., a ping request) from the first IC package to the second IC package and transmit an acknowledgement/reply from the second IC package back to the first IC package. The difference between the time the message is transmitted and the time the acknowledgement/reply is received is the round-trip time. The latency of the data link may be calculated by dividing the determined round trip time by two.

After determining the latency of the data link, debugging operations are performed by the first and second IC packages at blocks 306 through 320. At block 306, test input data received by the first IC package (e.g., via a JTAG interface), is communicated to the second IC package via the data link. In the IC package, the input test data is provided to a logic circuit in the first IC package at block 308. At block 310, a first set of signals are captured from the logic circuit in the first IC package. In the second IC package, the input test data is provided to a logic circuit in the second IC package at block 316. At block 318, a second set of signals are captured from the logic circuit in the second IC package. At block 320, the second set of signals are communicated to the first IC package via the data link.

As a result of the latency of the data link, the second set of data signals are received by the first IC package later than the first set of data signals. At block 312, the first and second sets of data signals are aligned according to the latency determined at block 304. In one example implementation, the first and second signals may be aligned by delaying the first set of data signals by an amount of time equal to the determined latency. At block 314, the aligned data signals are output (e.g., via a JTAG interface).

Figure 4:
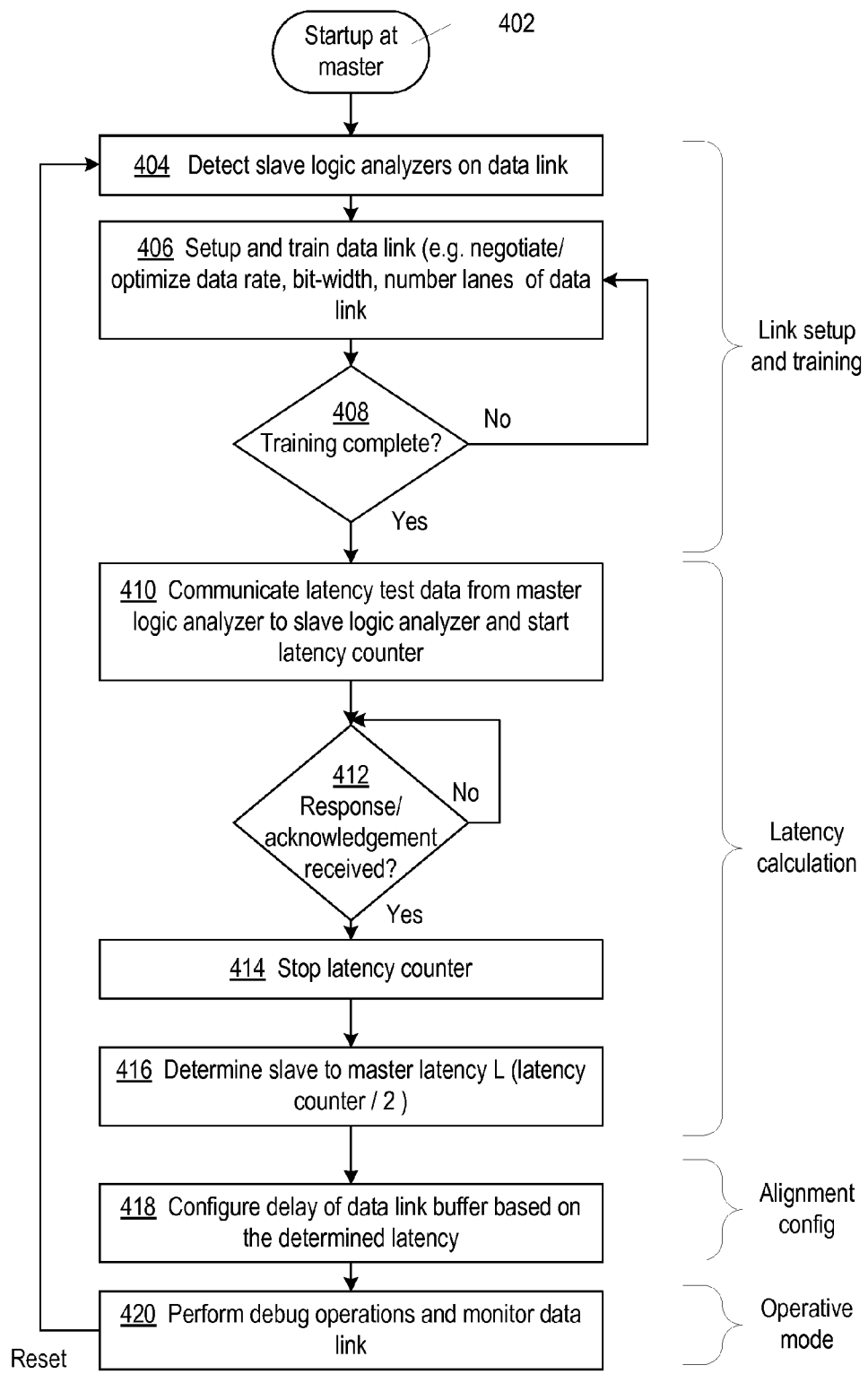
FIG. 4 shows an example process for setting up, training, and determining latency of a link between two IC packages, in accordance with one or more implementations.

FIG. 4 shows an example process for setting up, training, and determining latency of a link between two IC packages, in accordance with one or more implementations. In this example, the process is initiated at startup of a master logic analyzer in the first IC package at block 402. At block 404, devices (e.g., a slave logic analyzer) connected to a data link are detected. At block 406, the data link is setup and trained. As previously described with reference to FIG. 3, link setup negotiates some initial protocol parameters of the data link between the devices detected at block 404. Link training tests communication via the data link using various parameter settings to maximize performance of the data link. For example, a known pattern may be transmitted on the data link to evaluate operation of the data link for different parameter values (e.g., transmission data rates, lane widths, packet size). As an illustrative example, data rate may be iteratively increased until the bit error rate (BER) of the transmission exceeds a threshold BER (e.g., a number of bit errors that may be corrected using forward error correction).

The processes performed at block 406 are repeated until training of the data link has completed at decision block 408. At block 410, a latency test message is communicated from the master logic analyzer to a slave analyzer via the data link and a latency counter is started. The process is halted at decision block 412 until a response or acknowledgement message is received from the slave logic analyzer. Once the response or acknowledgement message is received, the latency counter is stopped at block 414. At block 416, the slave to master latency of the data link is determined. In this example, the latency of the data link is calculated by dividing a time indicated by the latency counter in half. At block 418, a delay of a data link buffer is configured based on the determined latency for alignment of captured data signals. At block 420, debugging operations (e.g., probing signals) are performed and the data link is monitored. If the data link is reset, the process shown in FIG. 4 is repeated to setup and train the link, calculate latency and configure alignment circuits.

Figure 5:
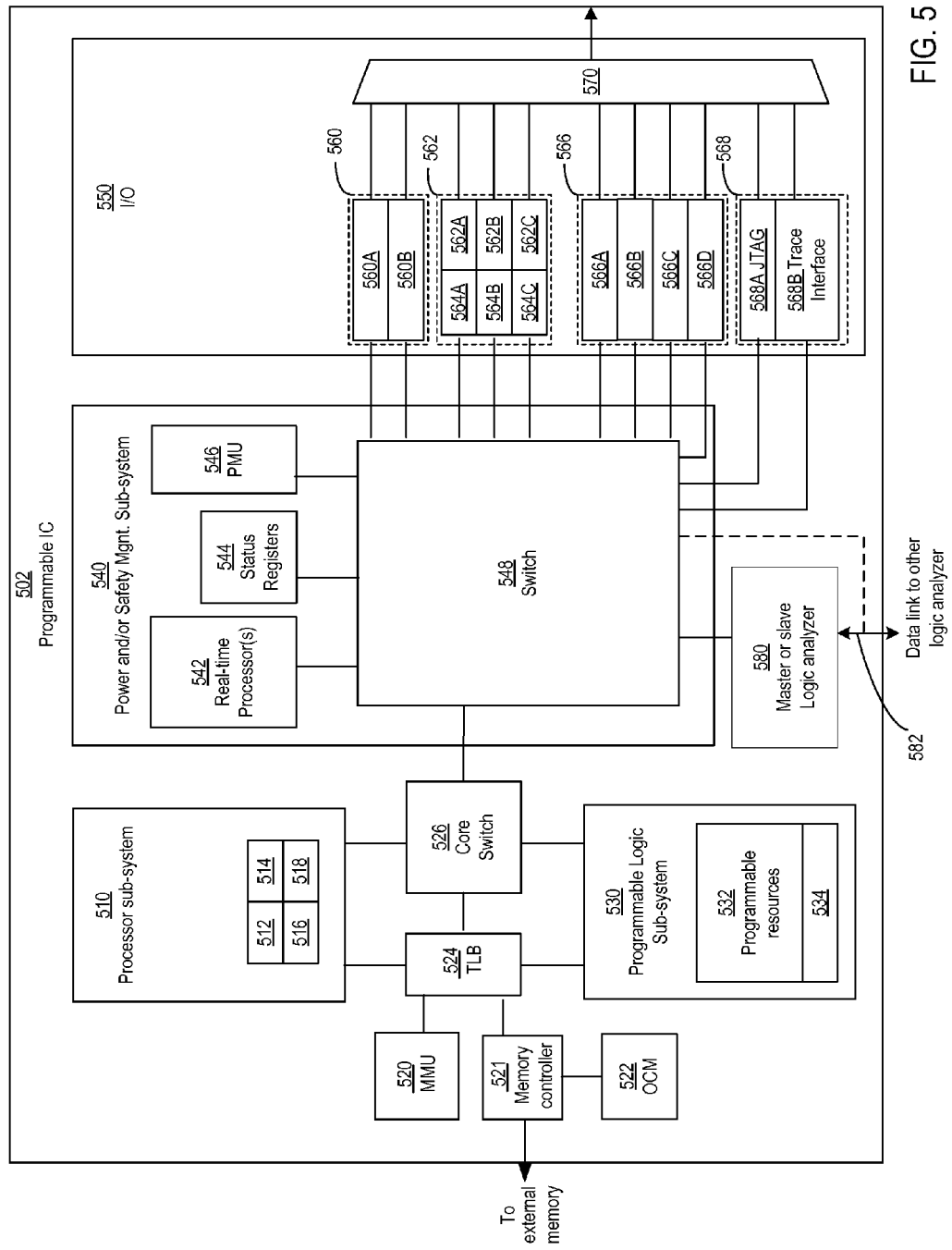
FIG. 5 shows an example programmable IC having a logic analyzer circuit, in accordance with one or more implementations.

FIG. 5 shows a programmable IC 502 having a logic analyzer 580 consistent with one or more implementations. The programmable IC may also be referred to as a System On Chip (SOC), which includes a processing sub-system 510 and a programmable logic sub-system 530. In this example, the programmable IC also includes a sub-system 540 having various circuits for power and/or safety management and an input/output (I/O) sub-system 550 for communication of data with external circuits. The subsystems 510, 530, 540, and 550 may be formed using a plurality of semiconductor dies, and interconnected in an IC package as described in the above examples.

The processing sub-system 510 may be programmed to implement a software portion of the user design, via execution of a user program. The program may be specified as part of a configuration data stream or may be retrieved from an on-chip or off-chip data storage device. The processing sub-system 510 may include various circuits 512, 514, 516, and 518 for executing one or more software programs. The circuits 512, 514, 516, and 518 may include, for example, one or more processor cores, floating point units (FPUs), an interrupt processing unit, on chip-memory, memory caches, and/or cache coherent interconnect.

The programmable logic sub-system 530 of the programmable IC 502 may be programmed to implement a hardware portion of a user design. For instance, the programmable logic sub-system may include a number of programmable resources 532, which may be programmed to implement a set of circuits specified in a configuration data stream. The programmable resources 532 include programmable interconnect circuits, programmable logic circuits, and configuration memory cells. The programmable logic implements the logic of a user design using programmable elements that can include, for example, function generators, registers, arithmetic logic, and so forth. Programmable interconnect circuits may include a large number of interconnect lines of varying lengths interconnected by programmable interconnect points (PIPs).

The programmable resources 532 may be programmed by loading a configuration data stream into the configuration memory cells, which define how the programmable interconnect circuits and programmable logic circuits are configured. The collective states of the individual memory cells then determine the function of the programmable resources 532. The configuration data can be read from memory (e.g., from an external PROM) or written into the programmable IC 502 by an external device. In some implementations, configuration data may be loaded into configuration memory cells by a configuration controller 534 included in the programmable logic sub-system 530. In some other implementations, the configuration data may be loaded into the configuration memory cells by a start-up process executed by the processor sub-system 510.

The programmable IC 502 may include various circuits to interconnect the processing sub-system 510 with circuitry implemented within the programmable logic sub-system 530. In this example, the programmable IC 502 includes a core switch 526 that can route data signals between various data ports of the processing sub-system 510 and the programmable logic sub-system 530. The core switch 526 may also route data signals between either of the programmable logic or processing sub-systems 510 and 530 and various other circuits of the programmable IC, such as an internal data bus. Alternatively or additionally, the processing sub-system 510 may include an interface to directly connect with the programmable logic sub-system—bypassing the core switch 526. Such an interface may be implemented, for example, using the AMBA AXI Protocol Specification (AXI) as published by ARM.

In some implementations, the processing sub-system 510 and the programmable logic sub-system 530 may also read or write to memory locations of an on-chip memory 522 or off-chip memory (not shown) via memory controller 521. The memory controller 521 can be implemented to communicate with one or more different types of memory circuits including, but not limited to, Dual Data Rate (DDR) 2, DDR3, Low Power (LP) DDR2 types of memory, whether 16-bit, 32-bit, 16-bit with ECC, etc. The list of different memory types with which memory controller 521 is able to communicate is provided for purposes of illustration only and is not intended as a limitation or to be exhaustive. As shown in FIG. 5, the programmable IC 502 may include a memory management unit 520 and translation look-aside buffer 524 to translate virtual memory addresses used by the sub-systems 510 and 530 to physical memory addresses used by the memory controller 521 to access specific memory locations.

In this example, the programmable IC includes an I/O sub-system 550 for communication of data with external circuits. The I/O sub-system 550 may include various types of I/O devices or interfaces including for example, flash memory type I/O devices, higher performance I/O devices, lower performance interfaces, debugging I/O devices, and/or RAM I/O devices.

The I/O sub-system 550 may include one or more flash memory interfaces 560 illustrated as 560A and 560B. For example, one or more of flash memory interfaces 560 can be implemented as a Quad-Serial Peripheral Interface (QSPI) configured for 4-bit communication. One or more of flash memory interfaces 560 can be implemented as a parallel 8-bit NOR/SRAM type of interface. One or more of flash memory interfaces 560 can be implemented as a NAND interface configured for 8-bit and/or 16-bit communication. It should be appreciated that the particular interfaces described are provided for purposes of illustration and not limitation. Other interfaces having different bit widths can be used.

The I/O sub-system 550 can include one or more interfaces 562 providing a higher level of performance than flash memory interfaces 560. Each of interfaces 562A-562C can be coupled to a DMA controller 564A-564C respectively. For example, one or more of interfaces 562 can be implemented as a Universal Serial Bus (USB) type of interface. One or more of interfaces 562 can be implemented as a gigabit Ethernet type of interface. One or more of interfaces 562 can be implemented as a Secure Digital (SD) type of interface. One or more of interfaces 562 can be implemented as a PCIe interface.

The I/O sub-system 550 may also include one or more interfaces 566 such as interfaces 566A-566D that provide a lower level of performance than interfaces 562. For example, one or more of interfaces 566 can be implemented as a General Purpose I/O (GPIO) type of interface. One or more of interfaces 566 can be implemented as a Universal Asynchronous Receiver/Transmitter (UART) type of interface. One or more of interfaces 566 can be implemented in the form of a Serial Peripheral Interface (SPI) bus type of interface. One or more of interfaces 566 can be implemented in the form of a Controller-Area-Network (CAN) type of interface and/or an $I^2C$ type of interface. One or more of interfaces 566 also can be implemented in the form of a Triple Timer Counter (TTC) and/or a Watchdog Timer (WDT) type of interface.

The I/O sub-system 550 can include one or more debug interfaces 568 such as processor JTAG (PJTAG) interface 568A and a trace interface 568B. PJTAG interface 568A can provide an external debug interface for the programmable IC 502. Trace interface 568B can provide a port to receive debug, e.g., trace, information from the processing sub-system 510 or the programmable logic sub-system 530.

As shown, each of interfaces 560, 562, 566, and 568 can be coupled to a multiplexer 570. Multiplexer 570 provides a plurality of outputs that can be directly routed or coupled to external pins of the programmable IC 502, e.g., balls of the package within which the programmable IC 502 is disposed. For example, I/O pins of programmable IC 502 can be shared among interfaces 560, 562, 566, and 568. A user can configure multiplexer 570, via a configuration data stream to select which of interfaces 560-568 are to be used and, therefore, coupled to I/O pins of programmable IC 502 via multiplexer 570. The I/O sub-system 550, may also include a fabric multiplexer I/O (FMIO) interface (not shown) to connect interfaces 562-568 to programmable logic circuits of the programmable logic sub-system. Additionally or alternatively, the programmable logic sub-system 530 can be configured to implement one or more I/O circuits within programmable logic. In this example, the programmable IC 502 includes sub-system 540 having various circuits for power and/or safety management. For example, the sub-system 540 may include a power management unit 546 configured to monitor and maintain one or more voltage domains used to power the various sub-systems of the programmable IC 502. In some implementations, the power management unit 546 may disable power of individual sub-systems, when idle, to reduce power consumption, without disabling power to sub-systems in use.

The sub-system 540 may also include safety circuits to monitor the status of the sub-systems to ensure correct operation. For instance, the sub-system 540 may include one or more real-time processors 542 configured to monitor the status of the various sub-systems (e.g., as indicated in status registers 544). The real-time processors 542 may be configured to perform a number of tasks in response to detecting errors. For example, for some errors, the real-time processors 542 may generate an alert in response to detecting an error. As another example, the real-time processors 542 may reset a sub-system to attempt to restore the sub-system to correct operation. The sub-system 540 includes a switch network 548 that may be used to interconnect various sub-systems. For example, the switch network 548 may be configured to connect the various sub-systems 510, 530, and 540 to various interfaces of the I/O sub-system 550. In some applications, the switch network 548 may also be used to isolate the real-time processors 542 from the sub-systems that are to be monitored. Such isolation may be required by certain application standards (e.g., IEC-61508 SIL3 or ISO-26262 standards) to ensure that the real-time processors 542 are not affected by errors that occur in other sub-systems.

The logic analyzer 580 is configured to capture data of one or more logic circuits in the programmable IC 502 such as processor sub-system 510, programmable logic sub-system 530, powered/safety management sub-system 540, or I/O subsystem 550. In some implementations, the logic analyzer 580 may be connected to the logic circuits via switch 548 to receive probed signals from logic circuits or provide test data input to the logic. Additionally or alternatively, the logic analyzer 580 may be connected to the logic circuit by dedicated signal lines (not shown). The logic analyzer 580 may receive test data input or debug commands and output probed data signals via one or more communication circuits in I/O sub-system 550 such as JTAG interface 568.

As described with reference to FIGS. 1-4, the logic analyzer 580 is configured to communicate data with other logic analyzer circuits via a data link 582. The logic analyzer 580 may be configured to operate as either a master analyzer or slave logic analyzer on the data link. In some implementations, the data link is provided by a communication circuit of I/O sub-system 550 (e.g., PCIe or Ethernet) coupled to the logic analyzer 580 via a signal path (shown as dashed line) and switch 548. Alternatively, the data link may be provided by a dedicated communication circuit separate from the I/O sub-system.

The disclosed methods and circuits are thought to be applicable to a variety of systems and applications. Other aspects and features will be apparent to those skilled in the art from consideration of the specification. Though aspects and features may in some cases be described in individual figures, it will be appreciated that features from one figure can be combined with features of another figure even though the combination is not explicitly shown or explicitly described as a combination. Various ones of disclosed processes and circuits may be implemented as one or more processors configured to execute software, as an application specific integrated circuit (ASIC), or as a logic on a programmable logic device. It is intended that the specification and drawings be considered as examples only, with a true scope of the invention being indicated by the following claims.

What is claimed is:

1. An apparatus, comprising:
   a first IC package, including:
   a first logic circuit; and
   a first logic analyzer circuit coupled to the first logic circuit and configured to:
   determine a first latency of a first data link; and
   in response to receiving test input data:
   communicate the test input data via the first data link;
   capture a first set of data signals from the first logic circuit;
   align the first set of data signals with a second set of data signals received via the first data link, based on the determined first latency, to produce an aligned set of data signals; and
   output the aligned set of data signals; and
   a second IC package communicatively coupled to the first IC package via the first data link and including:
   a second logic circuit; and
   a second logic analyzer circuit coupled to the second logic circuit and configured to, in response to receiving the test input data via the first data link:
   capture the second set of data signals from the second logic circuit; and
   communicate the second set of data signals to the first logic analyzer circuit via the first data link.

2. The apparatus of claim 1, wherein:
   the first logic analyzer circuit is configured to communicate a message from the first IC package to the second IC package via the first data link;
   the second logic analyzer circuit is configured to, in response to receiving the message, communicate a response from the second IC package to the first IC package via the first data link; and
   the first logic analyzer circuit is further configured to determine the first latency based on a difference between a first time at which the message is communicated by the first logic circuit and a second time at which the response is received by the first logic circuit.

3. The apparatus of claim 1, wherein the first logic analyzer circuit is configured to align the first and second sets of data signals by delaying the first set of data signals by an amount of time equal to the first latency.

4. The apparatus of claim 1, wherein the first and second logic analyzer circuits are further configured to initialize and train the first data link prior to the determination of the first latency by the first logic analyzer circuit.

5. The apparatus of claim 1, wherein:
   the first logic analyzer circuit is further configured and arranged to provide the test input data to the first logic circuit; and
   the second logic analyzer circuit is further configured and arranged to provide the test input data to the second logic circuit.

6. The apparatus of claim 1, wherein the first and second IC packages are configured to communicate the first and second sets of data signals via the first data link in a serialized format.

7. The apparatus of claim 1, wherein the first and second logic circuits each include a plurality of programmable resources.

8. The apparatus of claim 1, further comprising:
   a third IC package; and
   wherein the first logic analyzer circuit is further configured to:
   determine a second latency of a second data link between the first IC package and the third IC package in the apparatus;
   in further response to receiving the test input data, communicate the test input data to the third IC package via the second data link.

9. The apparatus of claim 8, wherein the third IC package includes:
   a third logic circuit; and
   a third logic analyzer circuit coupled to the third logic circuit and configured to, in response to receiving the test input data via the second data link:
   capture a third set of data signals from the third logic circuit; and
   communicate the third set of data signals to the first logic analyzer circuit via the second data link.

10. The apparatus of claim 9, wherein the first logic analyzer circuit is configured to align the first, second, and third sets of data signals, based on the determined first and second latencies to produce the aligned set of data signals; and output the aligned set of data signals from the apparatus.

11. The apparatus of claim 10, wherein the first logic analyzer circuit is configured to align the first, second, and third sets of data signals by:
    delaying the first set of data signals by an amount of time equal to the greater of the first and second latencies;
    in response to the first latency being greater than the second latency, delaying the second set of data signals by an amount of time equal to a difference between the first latency less the second latency; and
    in response to the second latency being greater than the first latency, delaying the first set of data signals by an amount of time equal to a difference between the second latency less the first latency.

12. A method for testing a device including a plurality of integrated circuit (IC) packages, comprising:
    using a first logic analyzer circuit included in a first IC package of the plurality of IC packages, performing operations including:
    determining a latency of a first data link between the first IC package and a second IC package of the plurality of IC packages;
    in response to receiving test input data at the first IC package:
    communicating the test input data to the second IC package via the first data link; and
    capturing a first set of data signals from a logic circuit of the first IC package; and
    using a second logic analyzer circuit included in the second IC package, and in response to receiving the test input data:
    capturing a second set of data signals from a logic circuit of the second IC package; and
    communicating the second set of data signals to the first IC package via the first data link; and
    using the first logic analyzer circuit:
    aligning the first and second sets of data signals, based on the determined latency of the first data link, to produce an aligned set of data signals; and
    outputting the aligned set of data signals from the device.

13. The method of claim 12, wherein the determining latency of the first data link includes:

communicating a message from the first IC package to the second IC package via the first data link;

in response to receiving the message at the second IC package, communicating a response from the second IC package to the first IC package via the first data link; and determining the first latency based on a difference between a first time at which the message is communicated by the first logic circuit and a second time at which the response is received by the first logic circuit.

14. The method of claim 12, wherein the aligning the first and second sets of data signals to produce an aligned set of data signals includes, delaying the first set of data signals by an amount of time equal to the determined latency.

15. The method of claim 12, further comprising, prior to determining the latency, initializing and training the first data link.

16. The method of claim 12, wherein the first and second IC packages are configured to communicate the first and second sets of data signals via the first data link in a serialized format.

17. The method of claim 12, wherein the first and second logic circuits are programmable ICs.

18. The method of claim 12, further comprising using the first logic analyzer circuit:

providing the test input data to the logic circuit in the first IC package; and using the second logic analyzer circuit, providing the test input data to the logic circuit in the second IC package.

19. The method of claim 12, further comprising:

using the first logic analyzer circuit, performing operations including:

determining latency of a second data link between the first IC package and a third IC package in the device;

in further response to receiving the test input data, communicating the test input data to the third IC package via the second data link; and using a third logic analyzer circuit included in the third IC package, performing operations including:

capturing a third set of data signals from a logic circuit of the second IC package;

communicating the third set of data signals to the first IC package via the second data link; and using the first logic analyzer circuit, performing operations including:

aligning the first, second, and third sets of data signals, based on the determined latencies of the first and second data links, to produce the aligned set of data signals; and outputting the aligned set of data signals from the device.

20. The method of claim 19, wherein aligning the first, second, and third sets of data signals includes:

delaying the first set of data signals by an amount of time equal to the greater of the first and second latencies;

in response to the first latency being greater than the second latency, delaying the second set of data signals by an amount of time equal to a difference between the first latency less the second latency; and in response to the second latency being greater than the first latency, delaying the first set of data signals by an amount of time equal to a difference between the second latency less the first latency.

* * * * *